United States Patent [19]

Vandenberg et al.

[11] Patent Number: 4,875,765
[45] Date of Patent: Oct. 24, 1989

[54] METHOD FOR CORRECTION OF DISTORTIONS OF A MIRROR

[75] Inventors: Donald E. Vandenberg, Brockport; Donald A. Jacques, Pittsford; William E. Schaffer, Spencerport, all of N.Y.

[73] Assignee: Eastman Kodak Company, Rochester, N.Y.

[21] Appl. No.: 226,339

[22] Filed: Jul. 29, 1988

[51] Int. Cl.⁴ .............................. G02B 5/10; G02B 7/18
[52] U.S. Cl. ..................................... 350/611; 350/360; 350/487
[58] Field of Search ............... 350/611, 607, 487, 360; 356/124, 124.5; 318/696

[56] References Cited

U.S. PATENT DOCUMENTS

| 4,226,507 | 10/1980 | Fuschetto | 350/611 |
| 4,620,790 | 11/1986 | Hufnagel | 356/124 |
| 4,664,488 | 5/1987 | Sawicki et al. | 350/611 |
| 4,773,748 | 9/1988 | Shih et al. | 350/611 |

Primary Examiner—Bruce Y. Arnold
Assistant Examiner—Martin Lerner
Attorney, Agent, or Firm—Stephen C. Kaufman

[57] ABSTRACT

A method for providing corrections of distortions of a mirror. Initial corrections may be provided through the use of active optics, to apply forces to the mirror to introduce deformations that cancel out the distortions. This action, in turn, may induce undesirable aberrations. The method of the invention provides steps for identifying, isolating and removing the induced undesirable aberrations, and computing new applied forces that cannot induce the undesirable aberrations.

6 Claims, 2 Drawing Sheets

| ABERRATION | FUNCTIONAL (P-V) (WAVES) | ANGLE (DEGREES) |
|---|---|---|
| INPUT ARRAY | | |
| BIAS | | |
| Y TILT | | |
| X TILT | | |
| POWER | 0.0001 | 0.0 |
| PRIMARY SPHERICAL | 0.0000 | 0.0 |
| PRIMARY COMA | 0.0000 | 42.7 |
| PRIMARY ASTIGMATISM | 18.3345 | 0.0 |
| PRIMARY TREFOIL | 0.0000 | 45.5 |
| PRIMARY TETRAFOIL | 0.0001 | -45.0 |
| PRIMARY PENTAFOIL | 0.0000 | 16.1 |
| PRIMARY HEXAFOIL | 0.3382 | -30.0 |
| SECONDARY SPHERICAL | 0.0000 | 0.0 |
| SECONDARY COMA | 0.0000 | -114.7 |
| SECONDARY ASTIGMATISM | 0.0800 | 90.0 |
| SECONDARY TREFOIL | 0.0000 | -4.1 |
| SECONDARY TETRAFOIL | 0.0000 | 0.0 |
| SECONDARY PENTAFOIL | 0.0000 | -17.0 |
| SECONDARY HEXAFOIL | 0.1637 | 0.0 |
| TERTIARY SPHERICAL | 0.0000 | 0.0 |
| TERTIARY COMA | 0.0000 | 60.3 |
| TERTIARY ASTIGMATISM | 0.1427 | 90.0 |
| TERTIARY TREFOIL | 0.0000 | 50.7 |
| TERTIARY TETRAFOIL | 0.0000 | 0.0 |
| TERTIARY PENTAFOIL | 0.0000 | 5.6 |
| TERTIARY HEXAFOIL | 0.0677 | -30.0 |

FIG. 2

METHOD FOR CORRECTION OF DISTORTIONS OF A MIRROR

CROSS-REFERENCE TO A RELATED APPLICATION

This application is related to a copending and commonly assigned U.S. patent application Ser. No. 07/225,901 filed July 29, 1988 to Marino et al., which is being filed contemporaneously with this application. The entire disclosure of this copending application is incorporated by reference herein.

BACKGROUND OF THE INVENTION

1. Field of the Invention

This invention relates to a method that can provide corrections of distortions of a mirror.

2. Introduction to the Invention

It is well known to employ a mirror as an important component of an optical system, for example, a telescope. To this end, it is desirable that the surface accuracy of the mirror should have an optimal optical quality. For example, it is desirable that the optical quality of the mirror should not be unduly compromised by mirror shape distortions due to, e.g., thermal distortions, material inhomogeneities, stress relaxation, or errors in support forces. One method of compensation for this possible fall off in optical qaulity is to apply forces to the mirror, thus introducing deformations that cancel out the accumulated errors. This method is referred to as active optics. For details on active optics, reference may be made for example to R. N. Wilson, F. Franza and L. Noethe, "Active optics I: a system for optimizing the optical quality and reducing the costs of large telescopes, J. Modern Opt. 34(4) 485–509 (1987); J. H. Hardy, "Active optics—don't build a telescope without it!" in International Conference on Advanced Technology Optical Telescopes, G. Burbidge and L. D. Barr, eds., Proc. SPIE 332, 252–259 (1982); and F. B. Ray and T. Y. Chunt, "Surface analysis of an actively controlled telescope primary mirror under static loads," Appl. Opt. 24(4), 564–569 (1985). The disclosures of each of these references is incorporated by reference herein.

SUMMARY OF THE INVENTION

It has been proposed to use active optics in conjunction with the setup disclosed in Pearson et al., "Active optics correction of thermal distortion of a 1.8 meter mirror", Optical Engineering, Vol. 27, No. 2, (115–122), Feb. 1988. The Pearson et al. setup is shown in FIG. 1 and includes a mirror 10 that is supported from a base structure 12 by way of a plurality of position actuators 14. The setup further includes a plurality of force actuators 16 which can apply forces to the mirror 10 in accordance with the method of active optics disclosed above. In one embodiment, the Pearson eta al. setup gathers optical test information on the mirror 10 by way of a camera 18. The test information may be used as an input to a control system 20 on a quasi-real-time basis. The camera 18 and the control system 20 define a closed feedback loop 22 that closes around the camera 18 and the control system 20. The control system 20 can determine a set of force commands to correct the predicted mirror 10 distortions, and input this information to the force actuators 16.

We have extended the work of Pearson et al. in the following way. First, we have recognized that, while the Pearson et al. setup is useful, it may not provide optimal results and be entirely faithful to the goal of removing the distortions of the mirror. This follows for the following reasons. Pearson et al. determine a set of force commands by way of an evaluation of the classical and ideal Zenike polynomials. The Zernike polynomials are explained in the text Principles of Optics, Born and Wolf, Pergamon Press, 1965, Chapter 9. The Zernike polynomials are defined as orthogonal, and they may be mapped on a one to one basis with an infinity of possible global mirror distortions. For example, the orthogonal (hence, independent) Zernike polynomials may be uniquely mapped on a one to one basis with a global mirror distortion such as bias, tilt, power, coma, astigmatism, quatrefoil and trefoil, etc.

As stated, a crucial assumption in the ideal Zernike polynomial expansion is that the polynomials, hence the sundry mirror distortions, are orthogonal or independent. Based on this assumption, the Pearson et al. setup purports to correct a first global mirror distortion, say power, by using a first set of force commands, then, independently, attempting to correct a second global mirror distortion, say coma, by using a second set of force commands. This scheme may be continued indefinitely through a desired list of global mirror distortions to be corrected.

We have shown, so far, that the success of the Pearson et al. setup in removing a global mirror distortion, may be tied to its successful employment of the ideal Zernike polynomial. We have recognized, however, that the Zenike polynomial is couched within an ideal, textbook world, and that in the real-work-a-day-world of our optical systems, including the FIG. 1 setup, it may be very difficult or impossible to replicate the constraints or boundary conditions, etc., which are pre-supposed by the ideal Zernike polynomial. For this important situation, the ideal Zernike assumption of an invariant orthogonality may fall by the wayside. This, in turn, may result in a first set of force commands, which purport to correct for a primary global distortion, say power, inducing spurious and undesired secondary distortions, for example, coma and astigmatism. It is clear that if the induced, undesired distortions are significant, the goal of removing any distortions from the mirror may be frustrated.

The present invention addresses this problem and provides a solution to this problem. In one aspect, the invention provides a method for providing corrections of mirror aberrations, the method comprising the steps of:

(a) applying a first force matrix $[F_W]$ to the mirror for introducing first deformations that act to cancel out a global mirror aberration;

(b) forming a non-singular correction matrix CM comprising at least one column vector, wherein a column vector is dedicated to the global mirror aberration and includes at least one matrix element that carries information on the global mirror aberration, and at least one matrix element that carries informatin on undesired mirror aberrations induced by applying the first force matrix $[F_W]$;

(c) forming a participitation factor [PF] matrix by inverting the correction matrix, for eliminating the undesired mirror aberrations; and (d) generating a product matrix $[PF] \cdot [F_W] = [F_W]'$, for producing a second force matrix $[F_W]'$ for applying to the mirror second deformations.

BRIEF DESCRIPTION OF THE DRAWING

The invention is illustrated in the accompanying drawings in which:

FIG. 2 provides a Table that may be used to explain the advantages of the method of the invention.

DETAILED DESCRIPTION OF THE INVENTION

Figure 1:
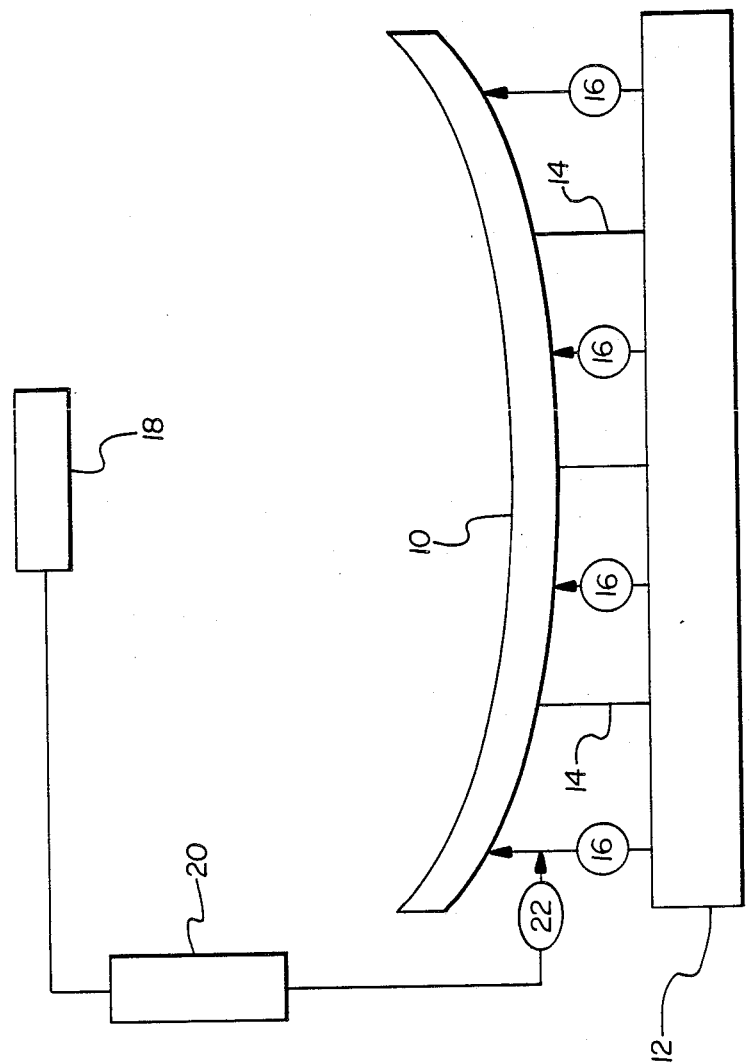
FIG. 1 shows an active optics setup.

Attention is again directed to FIG. 1, which provides a suitable framework for the method of the invention. It is recalled that FIG. 1 shows a mirror 10 that is supported from the base structure 12 by way of the plurality of position actuators 14. Also shown are the plurality of force actuators 16 which can apply forces to the mirror 10 in accordance with the method of active optics disclosed above. A preferred assembly that optimally realizes this method of active optics is disclosed in the copending and commonly assigned U.S. patent application Ser. No. 07/225,901 incorporated by reference herein. The preferred assembly features a force actuator which comprises a closed feedback loop that closes around the force actuator. An advantage of the closed feedback loop is that, in response to a disturbance to the force actuator, the feedback loop can maintain a desired controlled force for application to the mirror. Continuing, the force actuators 16 apply forces to the mirror 10 to the end of introducing deformations that act to cancel out a global mirror aberration. Examples of such global mirror aberrations include bias, tilt, power, coma, astigmatism, quatrefoil and trefoil.

Assume, now, that the force actuators 16 apply forces to the mirror 10 to cancel out one of these global aberrations, for example, the power aberration. A force matrix to provide this capability may be given by $$F_1 = \begin{bmatrix} f_{P1} \\ f_{P2} \\ \cdot \\ \cdot \\ \cdot \\ f_{Pn} \end{bmatrix}_{n \times 1}$$

$F_1$ is an (nx1) matrix that is dedicated to canceling out the power (P) aberration. Each element in the $F_1$ matrix represents a force $f_{Pn}$ that may be applied locally to the mirror 10, by one of the n force actuators 16, in order to cancel out the global mirror power aberration.

As further examples of using the force actuators 16 to apply forces to the mirror 10 to cancel out aberrations, we now develop the following matrices $F_2$, $F_3$, $F_4$ which can act individually to cancel out the global aberrations coma (C), astigmatism (A) and quatrefoil (Q), respectively:

$$F_2 = \begin{bmatrix} f_{C1} \\ f_{C2} \\ \cdot \\ \cdot \\ \cdot \\ f_{Cn} \end{bmatrix}_{n \times 1} ; F_3 = \begin{bmatrix} f_{A1} \\ f_{A2} \\ \cdot \\ \cdot \\ \cdot \\ f_{An} \end{bmatrix}_{n \times 1} ; F_4 = \begin{bmatrix} f_{Q1} \\ f_{Q2} \\ \cdot \\ \cdot \\ \cdot \\ f_{Qn} \end{bmatrix}_{n \times 1}$$

The matrices $F_2$, $F_3$ and $F_4$, like $F_1$, are (nx1) matrices. Each element in the matrix represents a force that may be applied locally to the mirror 10 by one of the n force actuators 16, in order to cancel out the indicated global mirror aberration. Note that other matrices $F_5$, $F_6$, ... $F_W$ may be developed in a similar way, to cancel out other global aberrations, like bias or trefoil, for example.

We have recognized that when a selected first force matrix $F_W$ is applied to the mirror 10 to cancel out a primary or "desired" global mirror aberration, further unwanted or undesired mirror aberrations may result. This may occur, as discussed above, when it is not possible to realize the ideal Zernike assumption of an invariant orthogonality between the force matrices $F_W$. For example, assume that the force matrix $F_3$ is selected in order to cancel out the mirror 10 global astigmatism aberration. This primary action may induce further undesired mirror aberrations, like power, coma and quatrefoil. In the same way, for example, we have found that when the force matrix $F_1$ is selected in order to cancel out the mirror 10 global power aberration, the indicated primary action may induce the undesired mirror aberrations of coma, astigmatism and quatrefoil. We generalize this situation by defining the following matrices $A_1$, $A_2$, $A_3$ and $A_4$:

Power   Coma   Astigmatism   Quatrefoil $$A_1 = \begin{bmatrix} P \\ c \\ a \\ q \end{bmatrix}; A_2 = \begin{bmatrix} p \\ C \\ a \\ q \end{bmatrix}; A_3 = \begin{bmatrix} p \\ c \\ A \\ q \end{bmatrix}; A_4 = \begin{bmatrix} p \\ c \\ a \\ Q \end{bmatrix}$$

Each of the matrices $A_1$, $A_2$, $A_3$ and $A_4$ is dedicated to one of the global mirror 10 aberrations we primarily desire to cancel out, for example, power, coma, aastigmatism and quatrefoil. Each of the matrices is a (4x1) matrix. Each element of each matrix is designated by either a capital letter or a lowercase letter. The capital letter indicates the primary mirror aberration we desire to cancel out, while the lower case letter indicates the undesired mirror aberration that may be induced by the primary action. For example, the matrix $A_4$ is dedicated to the global mirror aberration called quatrefoil. The elements of the matrix $A_4$ comprise undesired mirror aberrations (lowercase) power (p), coma (c), astigmatism (a), and the desired aberration (capitalized) quatrefoil (Q). Note that other matrices $A_5$, $A_6$ ... $A_W$ may be developed in a similar way, each such matrix being dedicated to one of the myriad global mirror aberrations. Note further that in this process, the matrices are incrementally sized, so e.g., $A_5$ is a (5x1) matrix, and $A_8$ is an (8x1) matrix, etc.

Continuing, an important step of the method of the invention, as summarized above, is to remove the unwanted and undesired residual aberrations. This step may be accomplished by way of first forming a non-singular correction matrix (CM), as follows:

$$[CM] = \begin{bmatrix} A_{1P} & A_{2p} & A_{3p} & A_{4p} \\ A_{1c} & A_{2C} & A_{3c} & A_{4c} \\ A_{1a} & A_{2a} & A_{3A} & A_{4a} \\ A_{1q} & A_{2q} & A_{3q} & A_{4Q} \end{bmatrix}_{4 \times 4}$$

The correction matrix ([CM] represents a re-formating of the matrices $A_1$, $A_2$, and $A_4$. A column vector of the correction matrix, accordingly, is dedicated to one of the global aberrations, like power or coma, etc. Each element in a column vector is either capitalized or lower cased, thus indicating, as before, a desired aberration or an undesired aberration. For example, the second column vector of the correction matrix is dedicated to the global aberration coma, and comprises vector elements $A_{2p}$, $A_{2a}$ and $A_{2q}$ which are undesired aberrations (lowercased), and a vector element $A_{2C}$ which is a desired aberration (capitalized). Note that the correction matrix may be developed, that is, expanded, in a routine manner to accommodate the matrices $A_5$, $A_6$... $A_W$. In this process, the correction matrix simply adds the desired vector $A_W$ as an additional column. It is observed, therefore, that the correction matrix is always a square matrix.

The correction matrix [CM] thus formed provides a ready vehicle to the end of removing the undesired aberrations from the desired aberrations. The correction matrix, it may be observed, sets out the desired aberrations along the diagonal, namely the matrix elements $A_{1P}$, $A_{2C}$, $A_{3A}$, $A_{4Q}$. All of the undesired aberrations, on the other hand, are off-diagonal elements. Removing the undesired aberrations, in turn, is mathematically equivalent to first inverting the correction matrix [CM], thus forming a new matrix $[CM]^{-1}$, and then forming the matrix identity product [CM] $[CM]^{-1} = [I]$. By definition, the matrix identity product is a mathematical statement that all of the off-diagonal elements, i.e., the undesired aberrations, are equal to zero. At the same time, the diagonal elements, i.e., the desired aberrations, have a finite value. And this is of course what is wanted at this step of the method.

Note that the inverted correction matrix $[CM]^{-1}$ may be formed by mathematically dividing the adjoint matrix of [CM] by the determinant of [CM]. That is, $$[CM]^{-1} = \frac{\text{Adjoint of Correction Matrix}}{\text{Determinant of Correction Matrix}},$$

with the proviso that the determinant of the correction matrix is not equal to zero. The indicated inversion technique is explained, for example, in the reference Advanced Engineering Mathematics, Kreyszig, John Wiley and Sons, 1967, Chapter 7.

The inverted correction matrix $[CM]^{-1}$ has the following form:

$$[CM]^{-1} = \begin{bmatrix} A'_{1P} & A'_{2p} & A'_{3p} & A'_{4p} \\ A'_{1c} & A'_{2C} & A'_{3c} & A'_{4c} \\ A'_{1a} & A'_{2a} & A'_{3A} & A'_{4a} \\ A'_{1q} & A'_{2q} & A'_{3q} & A'_{4Q} \end{bmatrix}$$

The inverse correction matrix $[CM]^{-1}$ exists if, and only if, the correction matrix [CM] is non-singular and square. This condition of existence is assured by our stipulation that the correction matrix is sized by the number of desired and undesired aberrations. In other words, the correction matrix [CM], culled from the matrices $A_1 \ldots A_W$, is always a square correction matrix. Further, the inverse of the correction matrix [CM] is unique. That is, the inverse matrix $[CM]^{-1}$ is a vehicle by means of which an optimal mirror 10 aberration correction may be obtained.

A review of our discussion is now in order. We stated above that, when a selected first force matrix $[F_W]$ is applied to the mirror 10 to cancel out a primary or "desired" global mirror aberration, further unwanted or undesired mirror aberrations may be induced by this action. We attacked this situation by (1) defining the $A_W$ matrices, which matrices account for these undesired aberrations; (2) organizing the $A_W$ matrices into the correction matrix [CM]; and (3) demonstrating that the undesired aberrations could be removed by way of the inversion matrix $[CM]^{-1}$. What is required at this stage, therefore, is to go back to the original first force matrix $F_W$ and reevaluate its contents, with a view to providing a second force matrix $[F_W]'$ that cannot induce the undesired mirror aberrations.

This last step of providing a second force matrix $[F_W]'$ is done by way of defining a participation factor [PF] matrix, where $$[PF] = [CM]^{-1}[I] = [CM]^{-1}.$$

The participation factor [PF] matrix represents scalar multipliers. The scalar multipliers, when applied to the first force matrix $[F_W]$, generate a product force matrix $[F_W]'$ that cannot induce the undesired mirror aberrations. The product force matrix $[F_W]'$ is the required second force matrix. This statement may be expressed mathematically as $$[F_W]' = [PF][F_W].$$

Attention is now directed to FIG. 2, which provides a Table that may be used to explain the advantages of the method of the invention. The left hand column of the Table lists exemplary global mirror aberrations, from bias to tertiary hexafoil. The FIG. 1 setup was employed to introduce deformations that were intended to primarily cancel out the global distortion astigmatism. This action induced the undesirable mirror aberrations that complete the Table list. The magnitudes of the undesirable mirror aberrations are expressed in the second column. The third column expresses the orientation of the aberrations. Note that the magnitudes are significant, but are readily removed in accordance with the method of the invention.

We conclude by noting that the method of the invention generates a sequence of force matrices, namely, $[F_W] \rightarrow [F_W]'$. We have recognized that the $[F_W]$ matrix element values may be based on an ideal force computation evaluation, and that it may not be possible in practice to realize, by way of the actual hardware model of FIG. 1, the ideal force computations used in the sequence generation. The method of the invention, however, can accommodate this possible fall off in ideal force computation realization, in the following manner. A second correction matrix [CM]* is formed from the second force matrix $[F_W]'$. The second correction matrix [CM]* comprises matrix elements which are actual test data or test results. The second correction matrix is formed in a manner entirely analogous to that taught above for forming the correction matrix [CM]. Next, again analogously to that taught above, a second participation factor matrix [PF]* is formed, by inverting the second correction matrix [CM]* and multiplying it by the identity matrix viz.:

$$[PF]^* = [CM]^{*-}[I].$$

Finally, a desired third force matrix $[F_W]''$ is defined as $$[F_W]'' = [PF][F_W]'.$$

Note that the third force matrix $[F_W]''$ eliminates the effects due to particular hardware tolerance deviations or ideal force computation uncertainties.

What is claimed:

1. A method for providing corrections of mirror aberrations, the method comprising the steps of:
   (a) applying a first force matrix $[F_W]$ to the mirror for introducing first deformations that act to cancel out a global mirror aberration;
   (b) forming a non-singular correction matrix CM comprising at least one column vector, wherein a column vector is dedicated to the global mirror aberration and includes at least one matrix element that carries information on the global mirror aberration, and at least one matrix element that carries information on undesired mirror aberrations induced by applying the first force matrix $[F_W]$;
   (c) forming a participation factor [PF] matrix by inverting the correction matrix, for eliminating the undesired mirror aberrations; and
   (d) generating a product matrix $[PF].[F_W]=[F_W]'$, for producing a second force matrix $[F_W]'$ for applying to the mirror second deformations.

2. A method according to claim 1, wherein the first force matrix $[F_W]$ comprises a plurality of force vectors, each of which force vectors is applied to a predetermined mirror location by a force actuator.

3. A method according to claim 1, wherein the first force matrix $[F_W]$ comprises a plurality of force vectors, each of which force vectors is computed in accordance with the terms of a Zernike polynomial in order to cancel out a selected global mirror aberration.

4. A method according to claim 3, wherein the selected global mirror aberration includes one of at least power, coma, astigmatism and quatrefoil.

5. A method according to claim 1, wherein the participation factor [PF] matrix is mathematically defined as:

$$[PF] = [CM]^{-1} = \frac{\text{Adjoint of Correction Matrix}}{\text{Determinant of Correction Matrix}},$$

with the proviso that the determinant of the correction matrix is not equal to zero.

6. A method according to claim 1, further comprising the steps of:
   (e) forming a second correction matrix [CM]* based on the second force matrix $[F_W]'$;
   (f) forming a second participation factor [PF]* matrix by inverting the second correction matrix [CM]*, for eliminating the effects of ideal force computation assumptions; and
   (g) generating a second product matrix [PF]*, $[F_W]'=[F_W]''$, for producing a third force matrix $[F_W]''$ for applying to the mirror.

* * * * *